US012412001B2

(12) United States Patent
Isichei et al.

(10) Patent No.: US 12,412,001 B2
(45) Date of Patent: Sep. 9, 2025

(54) GENERATING WELL MODEL FLOW TABLES FOR ARTIFICIAL INTELLIGENT MODELS

(71) Applicant: Saudi Arabian Oil Company, Dhahran (SA)

(72) Inventors: Obiomalotaoso Leonard Isichei, Abqaiq (SA); Ayman Alkhalaf, Dammam (SA); Said Almalki, Dhahran (SA); Najmul Hasan Ansari, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 1003 days.

(21) Appl. No.: 17/499,026

(22) Filed: Oct. 12, 2021

(65) Prior Publication Data
US 2023/0114355 A1 Apr. 13, 2023

(51) Int. Cl.
*G06F 30/12* (2020.01)
*G06F 8/30* (2018.01)
(Continued)

(52) U.S. Cl.
CPC ............. *G06F 30/12* (2020.01); *G06F 8/315* (2013.01); *G06F 30/27* (2020.01); *G06N 20/00* (2019.01)

(58) Field of Classification Search
CPC .......... G06F 30/12; G06F 30/27; G06F 8/315; G06N 20/00
See application file for complete search history.

(56) References Cited

U.S. PATENT DOCUMENTS

| 4,757,314 A | 7/1988 | Aubin |
| 5,871,047 A | 2/1999 | Spath et al. |

(Continued)

FOREIGN PATENT DOCUMENTS

| CN | 102754105 | 10/2012 |
| CN | 203322437 | 12/2013 |

(Continued)

OTHER PUBLICATIONS

A. Alkhalaf, O. Isichei, N. Ansari, R. Milad, "Utilizing Machine Learning for a Data Driven Approach to Flow Rate Prediction", pp. 1-9, 2019 (Year: 2019).*

(Continued)

*Primary Examiner* — Kibrom K Gebresilassie
(74) *Attorney, Agent, or Firm* — Fish & Richardson P.C.

(57) ABSTRACT

Systems and methods include a computer-implemented method for well models. Historical well data for past operations of a well is received. An expanded minimum/maximum range of values for the historical well data is generated for parameters used in a well model. Object-oriented object instances are generated using the historical well data and the expanded range. Each object instance is an object that includes a specific combination of parameters within the expanded range. The well model is executed using the instances, generating result objects, each representing a result of the well model. A hybrid well model variant of the well model is generated using the object instances and result objects to model combinations of the object instances and the result objects. A data object encapsulating the object instances and result objects is passed by an object-oriented application to a machine learning model in an absence of database tables.

20 Claims, 4 Drawing Sheets

(51) Int. Cl.
*G06F 30/27* (2020.01)
*G06N 20/00* (2019.01)

(56) References Cited

U.S. PATENT DOCUMENTS

| | | | |
|---|---|---|---|
| 5,975,204 | A | 11/1999 | Tubel et al. |
| 6,046,685 | A | 4/2000 | Tubel |
| 6,356,844 | B2 | 3/2002 | Thomas et al. |
| 7,259,688 | B2 | 8/2007 | Hirsch et al. |
| 7,478,024 | B2 | 1/2009 | Gurpinar et al. |
| 7,584,165 | B2 | 9/2009 | Buchan |
| 7,828,065 | B2 | 11/2010 | Ross et al. |
| 8,280,635 | B2 | 10/2012 | Ella et al. |
| 8,761,911 | B1 | 6/2014 | Chapman et al. |
| 9,745,833 | B2 | 8/2017 | Carvajal et al. |
| 10,055,684 | B2 | 8/2018 | Fleming et al. |
| 10,133,831 | B2 | 11/2018 | Carvajal et al. |
| 10,317,331 | B2 | 6/2019 | Guner et al. |
| 10,345,764 | B2 | 7/2019 | Early et al. |
| 10,508,521 | B2 | 12/2019 | Shammari et al. |
| 10,586,173 | B2 | 3/2020 | Hammond et al. |
| 10,839,069 | B2 | 11/2020 | Shen et al. |
| 10,962,968 | B2 | 3/2021 | Al-Maghlouth et al. |
| 2004/0044499 | A1 | 3/2004 | House |
| 2005/0044451 | A1 | 2/2005 | Fry et al. |
| 2006/0010352 | A1 | 1/2006 | Mukherjee et al. |
| 2006/0086497 | A1 | 4/2006 | Ohmer et al. |
| 2007/0016389 | A1 | 1/2007 | Ozgen et al. |
| 2007/0198223 | A1 | 8/2007 | Ella et al. |
| 2007/0198234 | A1 | 8/2007 | Zangi et al. |
| 2007/0252717 | A1 | 11/2007 | Fielder |
| 2008/0251260 | A1 | 10/2008 | Ross et al. |
| 2010/0023269 | A1 | 1/2010 | Yusti et al. |
| 2010/0299125 | A1 | 11/2010 | Ding et al. |
| 2013/0035920 | A1 | 2/2013 | Al-Shammari |
| 2013/0151020 | A1 | 6/2013 | Manninen et al. |
| 2013/0175030 | A1 | 7/2013 | Ige et al. |
| 2013/0304680 | A1 | 11/2013 | Bailey et al. |
| 2014/0244552 | A1 | 8/2014 | Liu et al. |
| 2014/0261791 | A1 | 9/2014 | Grabau et al. |
| 2016/0123111 | A1 | 5/2016 | Kim |
| 2016/0217379 | A1 | 7/2016 | Patri et al. |
| 2017/0096889 | A1 | 4/2017 | Blanckaert et al. |
| 2017/0114619 | A1 | 4/2017 | Conn et al. |
| 2017/0284191 | A1 | 10/2017 | Martin et al. |
| 2017/0363088 | A1 | 12/2017 | Nguyen et al. |
| 2018/0165604 | A1 | 6/2018 | Minkin et al. |
| 2018/0171761 | A1 | 6/2018 | Schneider et al. |
| 2018/0188403 | A1 | 7/2018 | Halsey et al. |
| 2018/0230780 | A1 | 8/2018 | Klenner et al. |
| 2018/0372909 | A1 | 12/2018 | Mishkhes et al. |
| 2019/0287005 | A1 | 9/2019 | Subramaniyan et al. |
| 2020/0011169 | A1 | 1/2020 | Haghshenas et al. |
| 2020/0141412 | A1 | 5/2020 | Nguyen et al. |
| 2020/0150634 | A1 | 5/2020 | Gray et al. |
| 2021/0231003 | A1 | 7/2021 | Alkhalaf |
| 2021/0254451 | A1 | 8/2021 | Halder et al. |

FOREIGN PATENT DOCUMENTS

| | | |
|---|---|---|
| CN | 103842615 | 6/2014 |
| CN | 105493100 | 4/2016 |
| CN | 105706089 | 6/2016 |
| CN | 109558967 | 4/2019 |
| EP | 2951720 | 12/2015 |
| EP | 3073051 | 9/2016 |
| EP | 3376361 | 9/2018 |
| FR | 2950993 | 4/2011 |
| WO | WO 2007107815 | 9/2007 |
| WO | WO 2013090416 | 6/2013 |
| WO | WO 2015047594 | 4/2015 |
| WO | WO 2016010813 | 1/2016 |
| WO | WO 2016022069 | 2/2016 |
| WO | WO 2016153895 | 9/2016 |
| WO | WO 2016186627 | 11/2016 |
| WO | WO 2017040457 | 3/2017 |
| WO | WO 2017074883 | 5/2017 |
| WO | WO 2017111964 | 6/2017 |
| WO | WO 2017151838 | 9/2017 |
| WO | WO 2017161126 | 9/2017 |
| WO | WO 2017165949 | 10/2017 |
| WO | WO 2018033524 | 2/2018 |
| WO | WO 2018132786 | 7/2018 |
| WO | WO 2021073763 | 4/2021 |

OTHER PUBLICATIONS

O. Akinnikawe, S. Lyne, J. Roberts, Synthetic Well Log Generation Using machine learning Techniques, pp. 23-25, Jul. 2018 (Year: 2018).*

Akinnikawe et al., "Synthetic Well Log Generation Using Machine Learning Techniques," Unconventional Resources Technology Conference, Houston, Texas, Jul. 23-25, 2018, 16 pages.

AlAjmi et al., "Profiling Downhole Casing Integrity Using Artificial Intelligence," SPE-173422-MS, Society of Petroleum Engineers, SPE Digital Energy Conference and Exhibition in the Woodlands, Texas, Mar. 3-5, 2015, 13 pages.

Al-Ajmi et al., "Risk based statistical approach to predict casing leaks," SPE 183948, Presented at SPE Middle East Oil & Gas Show and Conference, Manama, Kingdom of Bahrain, Mar. 6-9, 2017; Society of Petroleum Engineers, 2017, 19 pages.

Al-Hajri et al., "Calculating Casing Leak Cross Flow Rate Using Surface Injection Data," SPE-188107-MS, Society of Petroleum Engineers (SPE), presented at the SPE Kingdom of Saudi Arabia Annual Technical Symposium and Exhibition, Dammam, Saudi Arabia, Apr. 24-27, 2017, 15 pages.

Alkhalaf et al., "Machine Learning Approach to Classify Water Cut Measurements using DAS Fiber Optic Data," SPE-197349-MS, Society of Petroleum Engineers, Nov. 2019, 9 pages.

Alkhalaf et al., "Utilizing Machine Learning for a Data Driven Approach to Flow Rate Prediction," SPE-197266-MS, Society of Petroleum Engineers, Nov. 2019, XP055792195, 9 pages.

Al-Mulhim et al., "Integrated Production Logging Approach for Successful Leak Detection Between Two Formations: A Case Study," SPE 174835, Presented at the SPE Annual Technical Conference and Exhibition, Houston, TX, Sep. 28-30, 2015; Society of Petroleum Engineers, 2015, 15 pages.

Al-Shehri, "Oil and Gas Wells: Enhanced Wellbore Casing Integrity Management through Corrosion Rate Prediction Using an Augmented Intelligent Approach," Sustainability, 2019, 11:818, 17 pages.

Alzate et al., "Generating Synthetic Well Logs by Artificial Neural Networks (ANN) Using MISO-ARMAX Model in Cupiagua Field," SPE-169388, presented at the SPE Latin American and Caribbean Petroleum Engineering Conference, Maracaibo, Venezuela, May 21-23, 2014, 14 pages.

Ardian et al., "Recovering Well Productivity in Banyu Urip Field," SPE 165793, Oct. 22, 2013, 7 pages.

Banks, "Take Control: Smart Valves Step Forward," (XP055401051), Offshore-Technology.com, Jun. 18, 2008; 6 pages, <http://www.offshore-technology.com/features/feature2034/>, 6 pages.

Batista et al., "A complexity-invariant distance measure for time series," Data Mining and Knowledge Discovery, Apr. 2013, 28(3): 634-669.

Batista et al., "m(6)A RNA Modification Controls Cell Fate Transition in Mammalian Embryonic Stem Cells," Cell Stem Cell vol. 15, No. 1-13, Dec. 4, 2014, 14 pages.

Box et al., Time series analysis: forecasting and control, 3rd ed., Prentice-Hall International, Inc., 1994, 598 pages.

Das et al., "Preventing leaks through RUL prediction modeling: case integrity in HP/HT environment," SPE 184417, Presented at the SPE Health, Safety, Security, Environment, & Social Responsibility Conference, New Orleans, LA, Apr. 18-20, 2017; SPE Health Safety Security, Environment, & Social Responsibility Conference—North America, 2017, 9 pages.

Falcone et al., "Model Predicts More Accurate PI Over a Field's Life," Oil and Gas Journal, Pennwell Houston, Texas, vol. 99, No. 12, Mar. 19, 2001, 5 pages.

(56) References Cited

OTHER PUBLICATIONS

Fulcher et al., "Highly comparative future-based time-series classification," IEEE Transactions in Knowledge and Data Engineering, May 2014, 26:3026-3037.

Gryzlov et al., "Novel Methods for Production Data Forecast Utilizing Machine Learning and Dynamic Mode Decomposition," SPE-202792-MS, Society of Petroleum Engineers, Nov. 2020, XP055792220, 12 pages.

Husain et al., "Quantifying the Intelligent Field Added Values," (SPE 167439) Oct. 30, 2013; 9 pages, <https://www.onepetro.org/download/conference-paper/SPE-167439-MS?id=conference-paper/SPE-167439-MS>.

Hwang and Elsinger, "Detecting Production Tubing Leak by Time Resolved Geochemical Analysis of Oils," SPE 29478, Society of Petroleum Engineers, presented at the Production Operations Symposium in Oklahoma City, OK, Apr. 2-4, 1995, 13 pages.

Mohaghegh et al., "Virtual Magnetic Imaging Logs: Generation of Synthetic MRI Logs from Conventional Well Logs," SPE 51075, presented at the 1998 SPE Eastern Regional Meeting, Pittsburg, PA, Nov. 9-11, 1998, 10 pages.

Richman and Moorman, "Physiological time-series analysis using approximate entropy and sample entropy," American Journal of Physiol. Health Circ. Physiol, Jul. 2000, vol. 278: H2039-H2049, 11 pages.

Sawyer et al., "A simulation-based spreadsheet program for history matching and forecasting shale gas production" Society of Petroleum Engineers, Oct. 1999, 8 pages.

Schreiber and Schmitz, "Discrimination power of measures for nonlinearity in a time series," Physical Review E, May 1997, 55(5): 5443-5447.

Singh et al., "Detecting Subsurface Fluid Leaks in Real-Time Using Injection and Production Rates," Advances in Water Resources 2017, 110: 147-165, 19 pages.

Siu et al., "Re-Engineering the Well Calibration Procedure for a Large Number of High Productivity Wells," SPE 66385, Proceedings of SPE Reservoir Simulation Symposium, Jan. 1, 2001, 14 pages.

Storey, "Building a Maintenance Management Program for Valves," Control Engineering, Web page, Apr. 17, 2014; 3 pages <http://www.controleng.com/industry-news/single-article/building-a-maintenance-management-program-for-valves/20afd59f11c5dec4ec222cc79937e40b.html>.

Tursinbayeva et al., "Improving TCO Well Integrity Process through Successful Deployment of Well Integrity Portal," SPE-189022-MS, Society of Petroleum Engineers (SPE), presented at the SPE Annual Caspian Technology Conference and Exhibition, Baku, Azerbaijan, Nov. 1-3, 2017, 14 pages.

Walker and Duncan, "Estimation of the Probability of an Event as a Function of Several Independent Variables," Biometrika, Jun. 1967, 54(1/2): 167-179.

Watfa, "Downhole Casing Corrosion Monitoring and Interpretation Techniques to Evaluate Corrosion in Multiple Casing Strings," SPE Production Engineering, Aug. 1991, 8 pages.

Yang et al., "Downhole leak detection: introducing a new wireline array noise tool," SPE 194264, Presented at the SPE/ICoTA Well Intervention Conference and Exhibition, The Woodlands, TX, Mar. 26-27, 2019; Society of Petroleum Engineers, 2019, 16 pages.

Yang et al., "Intelligent Oilfield—Cloud Based Big Data Service in Upstream Oil and Gas," IPTC-19418-MS, International Petroleum Technology Conference, Mar. 2019, XP055792661, 15 pages.

Yentes et al., "The Appropriate Use of Approximate Entropy and Sample Entropy with Short Data Sets," Annals of Biomedical Engineering, Feb. 2013, 41(2): 349-365.

* cited by examiner

GENERATING WELL MODEL FLOW TABLES FOR ARTIFICIAL INTELLIGENT MODELS

TECHNICAL FIELD

The present disclosure applies to techniques that can be used in production engineering practices in gas and oil wells.

BACKGROUND

In the oil and gas industry, machine learning models have become a major catalyst in supporting various production and reservoir engineering objectives. Traditionally, these models are developed using flow tables from physical models. The flow tables typically require logic for machine learning integration and storage. Storage required for large fields is usually in the order of millions of records in large databases (such as EXCEL, SQL, or ORACLE) for utilization in the machine learning model.

SUMMARY

The present disclosure describes techniques that can be used for generating well model flow tables for artificial intelligent models. In some implementations, a computer-implemented method includes the following. Historical well data corresponding to a well is received. The historical well data includes information about past operations of the well. An expanded minimum/maximum range of values is generated for parameters used in a well model for the well. The expanded minimum/maximum range of values expands a range of minimum/maximum values corresponding to the historical well data. Object-oriented object instances representing the historical well data are generated using the historical well data and the expanded minimum/maximum range of values. Each object instance is an object configured to be used by the well model and includes a specific combination of parameters within the expanded minimum/maximum range of values. The well model is executed using the object-oriented object instances. Result objects are generated based on the executing. Each result object is an object-oriented object instance representing a result of the well model. A hybrid well model variant of the well model is generated using the object-oriented object instances and the result objects. The hybrid of the well model models combinations of the object-oriented object instances and the result objects. A data object encapsulating the object-oriented object instances and the result objects is passed by an object-oriented application to a machine learning model. Passing the data object occurs in an absence of database tables. The machine learning model is used to improve performance of one or more wells.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method, the instructions stored on the non-transitory, computer-readable medium.

The subject matter described in this specification can be implemented in particular implementations, so as to realize one or more of the following advantages. Techniques of the present disclosure can be used to eliminate expensive, time-consuming middleware requirements associated with storage of data sets in traditional tables. Instead, a python object can be used to pass a created physical model data set directly to a machine learning model. Integration logic needed for physical tables can also be also eliminated. The techniques can include automating the process of updating and re-running well performance models each time new well test data is available. Flow tables can be generated faster without having to deal with the latency associated with middleware. The techniques can be based on the use of physical models and dedicated hardware for running the software. The databases can be properly configured to store metadata related to the model's performance, availability, and validity. Using these techniques can lead to a reduction in the storage requirements associated with traditional models (for example a ten times reduction). The techniques can also be easily integrated with workflows given the unique needs of an organization.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

The following detailed description describes techniques for generating well model flow tables for artificial intelligent models. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

Conventional artificial intelligence (AI) approaches use historical data to train a model. Using techniques of the present disclosure, a syntactic data can be generated using a physics-based model that is pre-calibrated to match the latest well performance. The physics-based model can be used to generate a training data set to feed an AI model with all possible what-if scenarios to make the AI model a true reflection of the physics-based model. This approach can extend the ability of the AI model to predict, with accuracy, scenarios that have never been seen in history. This provides an added value over conventional historical data-driven AI modeling approaches. The technology of hybrid modeling can be applied to all wells in a company's oil fields. The approach can use in-house software and backend services to track current physical models and track the process of building the hybrid models.

Techniques of the present disclosure can include linking a Python (or some other language) physical model to a Python artificially intelligent model. Doing this can eliminate the need to use a physical database or file to hold the data. A Python object can be used to capture the data and pass the data directly to a machine learning model. In this way, expensive, time-consuming middleware requirement being used to store the data set in traditional tables can be eliminated. A Python object can be used to pass the created physical model data set directly to the machine learning model. Integration logic to physical tables is also eliminated. This can lead to a huge cost savings by avoiding the need to store millions of records for multiple permutations for a large number of wells.

Figure 1:
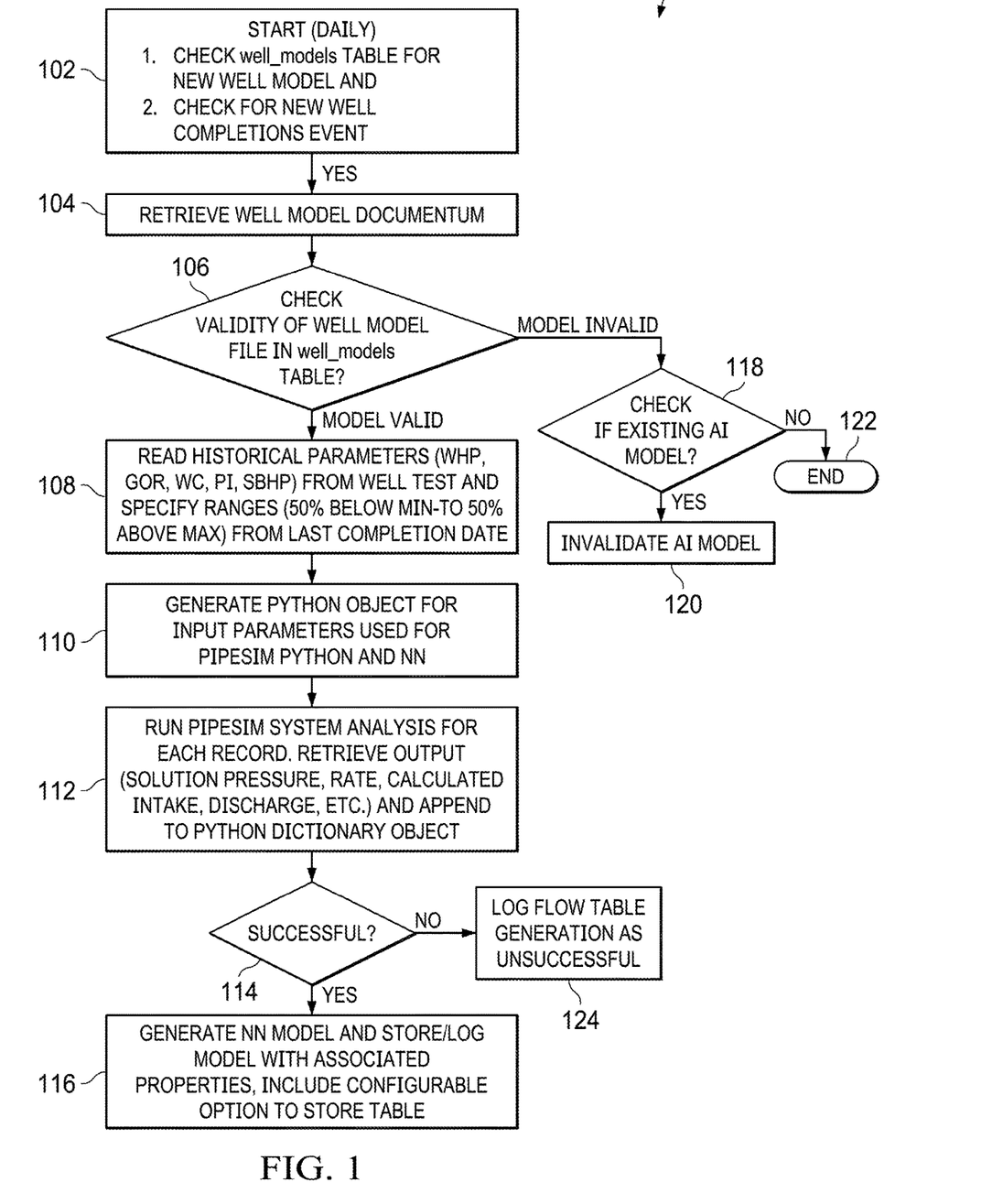
FIG. 1 is flow diagram showing an example of a workflow for generating well model flow tables, according to some implementations of the present disclosure.

Table 1 and the workflow of FIG. 1 can be part of a flow process for generating the flow tables seamlessly from Python to Python without utilizing, for example, any Oracle code.

physical model exists OR a completion event has been detected for an existing well, then the relevant physical models can be retrieved from a centralized cooperate system for storing files.

At 106, the validity of the well model file can be checked in the well models table. For example, this step can ensure that the physical model has been properly built. Sometimes, a model is flagged as invalid due to missing data. Systems can be limited to only work with valid models, so this step can check for that. Different processes can be used for automatically building and calibrating a physical well model.

If, at 106, the model is valid, then at 108 historical parameters (for example, WHP, GOR, WC, PI and SBHP) are read from the well test data and ranges are specified from the last completion date (for example, 50% below minimum to 50% above maximum values from historical well tests). For example, if the model is valid, then the system can build its hybrid variant. This can start with identifying the input parameters, and then fetching their values from historical well tests since last completions. The system can add 50% to a maximum and subtract 50% from minimum to cover all possible input scenarios.

At 110, a Python object is generated for input parameters used for PIPESIM Python and neural network (NN). The Python object can be considered as just a table, hence the name 'flow table', that has an input and an output. Each row in the table can include inputs and an output for one production scenario.

At 112, PIPESIM system analysis is run for each record. Output data (for example, solution pressure, rate, calculated

TABLE 1

Model Parameters

| Limits | Productivity Index (PI) | Reservoir Pressure | Well Head Pressure | Water cut | GOR | Pump Frequency |
|---|---|---|---|---|---|---|
| Minimum | Current Value in PIPESIM −40% | Minimum SBHP −20% | Minimum FWHP −30% | 0 | Minimum GOR − 40% | 30 |
| Maximum | Current Value in PIPESIM +40% | Maximum SBHP +20% | Maximum SIWHP +30% | Maximum WC +30% | Maximum GOR +40% | 70 |
| Value Spacing | Random ✓ Linear Geometric | Random ✓ Linear Geometric | Random ✓ Linear Geometric | Random ✓ Linear Geometric | Random ✓ Linear Geometric | Random ✓ Linear Geometric |
| Number Of values | 10 | 10 | 10 | 10 | 10 | 5 |

FIG. 1 is flow diagram showing an example of a workflow 100 for generating well model flow tables, according to some implementations of the present disclosure. At 102, the workflow can be started. A well models table can be checked for a new well model. A check can be made for new well completions events. For example, backend software can check all the physical models that have been built daily. If the software finds any new physical well models, then the software can convert the models to a hybrid variant. Moreover, the backend software can also check existing wells that have had a change in their completion. Changes in well completion can invalidate any previously-built well models, mandating the building of new well models that reflect the most recent well completion. An example of a well completion event is a change in the diameter of tubing, or a change in type/configuration of an artificial lift.

At 104, a well model can be retrieved, for example, from the well model repository. For example, if either a new intake, and discharge) is retrieved and appended to the Python dictionary object. If at 114, execution of the model was successful, then at 116, the NN model is generated and the model is logged/stored with associated propertied. A configurable option is included to store the table. If at 114, the execution of the model was unsuccessful, then at 124, the flow table generation is logged as unsuccessful.

If at 106, the model was determined to be invalid, then at 118 a check is made whether the existing AI model is used. If so, at 120, the AI model is invalidated. For example, the hybrid AI model can be flagged as invalid, since the source physical model is invalid and hybrid AI model is generated from it. If, at 118, the existing AI model is not used, then at 122 the workflow 100 can end.

Figure 2:
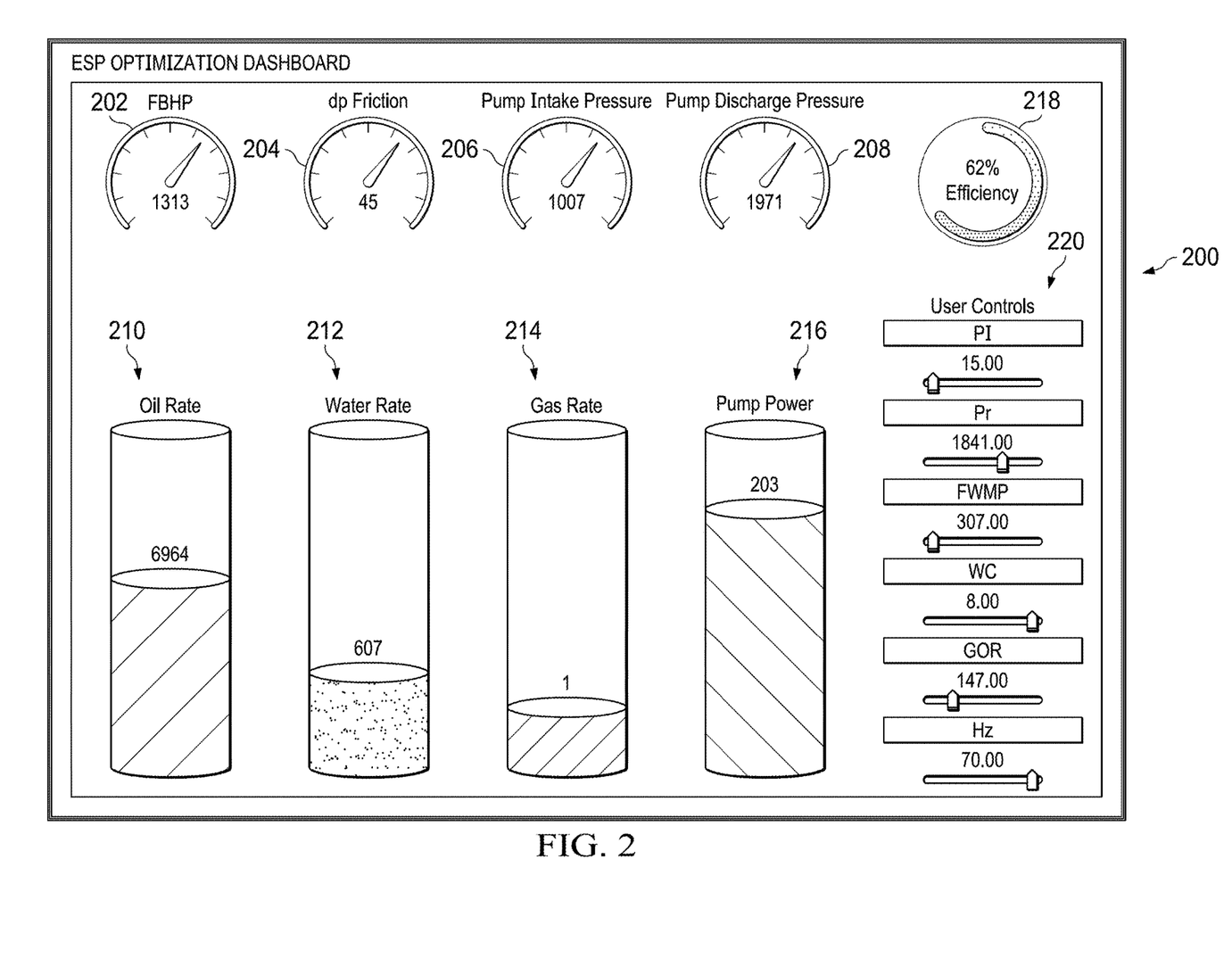
FIG. 2 is a screen shot showing an example of a user interface including an electric submersible pump (ESP) optimization dashboard, according to some implementations of the present disclosure.

FIG. 2 is a screen shot showing an example of a user interface 200 including an electric submersible pump (ESP) optimization dashboard, according to some implementations of the present disclosure. The user interface 200 includes readout meters for a flowing bottom hole pressure (FBHP), a diffusion pump (dp) function 204, a pump intake pressure 206, and a pump discharge pressure (or pump power) 208. The user interface 200 also includes volume charts for oil rate 210, water rate 212, gas rate 212, and pump power 216. An overall efficiency 218 provides an efficiency percentage for the plant. User controls 220 provide user controls for selecting a desired water cut, gas-oil ratio, wellhead pressure, reservoir pressure, productivity index, and pump frequency, for example, corresponding to the columns in Table 1.

In some implementations, the following pseudo-code (for example, Python code) can be used for a Vertical Lift Performance (VLP) generation process:

```
DBF_GET_ALL_WELLS(O: RC[well_name, ep_a_num])
For each well (I: RC)
    IF well has NO valid well_model
        Log it and continue
    ELSE
        [P] Generate boundaries from DB
            DBF_GET_WELL_TYPE(I: Well, O:Well_Type)
            DBF_GENERATE_BOUNDARIES_FROM_WELL_TEST(I:(Well,
Well_Type), O: RC[PN, MIN, MAX])
            DBF_APPLY_TOLERANCE(I: RC, O: RC[PN, NEW_MIN, NEW_MAX])
                Tolerance can be configurable in GCM
            DBF_APPLY_INCREMENT(I: RC, O: RC_P[PN, VAL])
                Where RC can be sorted 1st val = min, last val = max, vals in
between can be anything (randomized, fixed data-points, etc.)
        [P] Retrieve latest valid PIPESIM model
            DBF_GET_LATEST_VALID_WM_DCTM(I: Well, O: DCTM_ID)
            Call EPSE webAPI to retrieve (I: DCTM_ID, O: local_path_to_file)
            IF PIPESIM Model retrieved successfully
                Save the file locally on server (I: binary file, O: path) (will
decide later on naming convention and logical storage)
            ELSE
                Log it and continue
        [W+P] Generate VLP from PIPESIM
            Open(I: path)
            Set all parameters (I: RC_P)
            Call corresponding VLP generation API (O: data)
            Store data as file (I: data, O: local_path_to_file)
            Store file in DCTM (I: path, O: DCTM_ID)
            Store metadata in well_models (I: DCTM_ID and well)
            Remove local files regularly (need discussion when to remove/shared across other
workflows?)
            Save execution information as a record in DB for tracking (I: WM_version_used,
datEtime, well, etc.)
``` where DB=database (or example, Oracle EPPR), DBF_%=database function, O=output, I=input, RC=SYS_REFCURSOR, P=parallel, W=wait completion of previous steps, and PN=Parameter Name.

In some implementations, events that will dictate re-running the pseudo-code include new wells, new workovers, and/or a new max/min well test.

In some implementations, the following pseudo-code (for example, Python code) can be used for an AI model generation process:

```
DBF_GET_ALL_WELLS(O: RC[well_name, ep_a_num])
For each well (I: RC)
    IF well has NO VLP table
        Log it and continue
    ELSE
        Access VLP table (I:DCTM_ID OR file_path, O:VLP table)
        Remove rows where simulation didn't run (I: VLP_table,
O:VLP_table_clean)
        Separate input and output data(I: VLP_table_clean, O: (input_data,
output_data))
        Apply standardizing transformation on all data (I:(input_data,
output_data),O:(input_data_transformed,
```

*-continued*

```
output_data_transformed))
        Apply 5-fold cross validation, for every iteration:
            Randomly separate data into training (80%) and testing (20%)(I:
(input_data_transformed,
output_data_transformed),O:(input_data_transformed_train,
output_data_transformed_train, input_data_transformed_test,
output_data_transformed_test)
            Train the model
                Use neural networks[MLPRegressor( )]
                (I:( input_data_transformed_train,
                output_data_transformed_train), O:model)
            Test the model
                Feed test data into the model (
```

*-continued*

```
input_data_transformed_test -> model)
            Get model predictions (model -> output_data_predictions)
            Compare predicted and actual (I:(
            output_data_transformed_test, output_data_predictions),
            O: (MEA, R2))
        Compute Average MEA and R2 for all iterations
        Create a python object that stores model, transformation objects,
        average MEA, and average R2(I: model, ss_x, ss_y, MEA, R2,
        O:model_object)
        Store object in DCTM(I: model object, O:DCTM ID)
        Store metadata in well models(I:DCTM_ID and well)
        Store execution log (I: status, number of records trained with, etc.)
```

Figure 3:
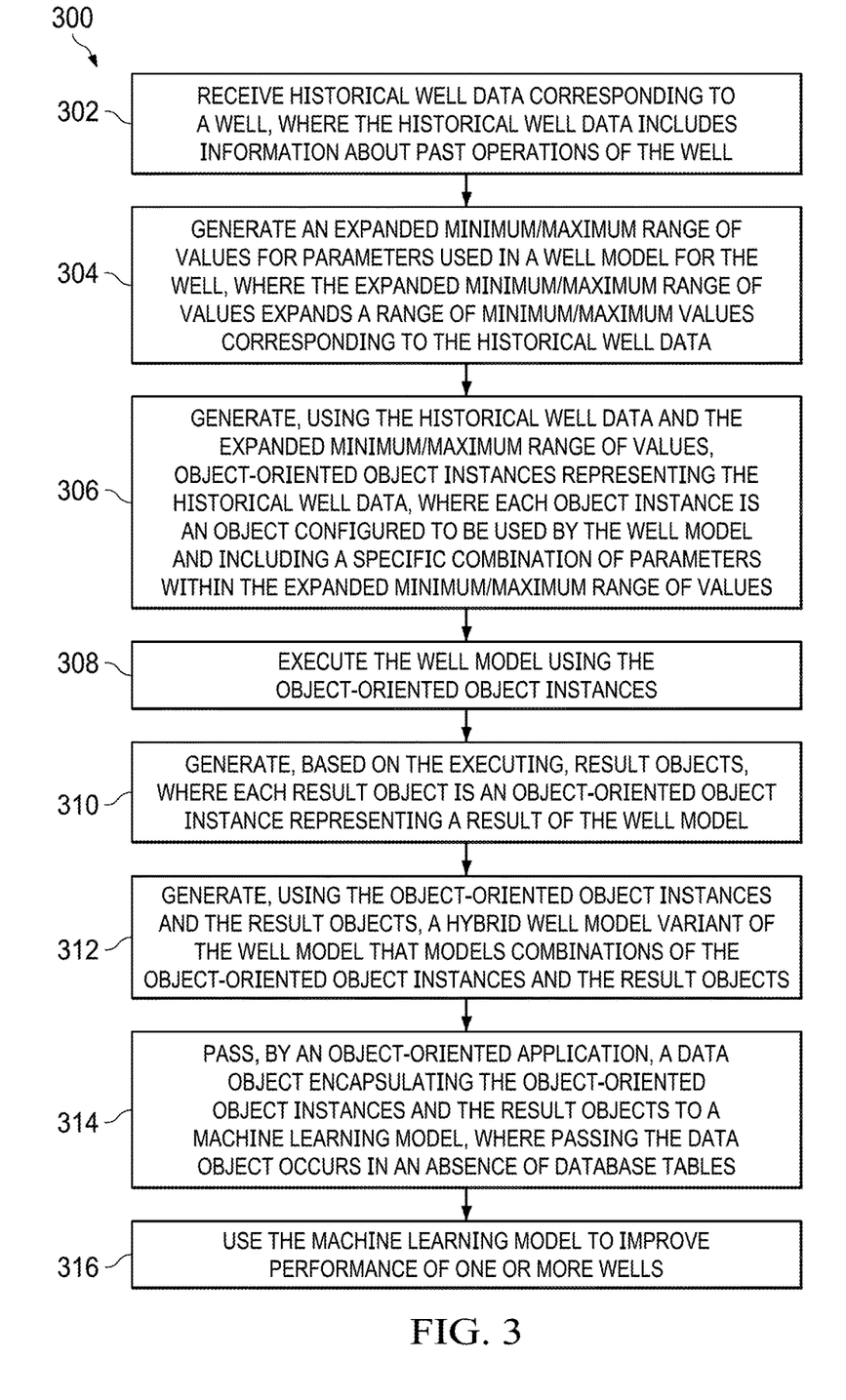
FIG. 3 is a flowchart of an example of a method for generating well model flow tables for artificial intelligent models, according to some implementations of the present disclosure.

FIG. 3 is a flowchart of an example of a method 300 for generating well model flow tables for artificial intelligent models, according to some implementations of the present disclosure. For clarity of presentation, the description that follows generally describes method 300 in the context of the other figures in this description. However, it will be understood that method 300 can be performed, for example, by any suitable system, environment, software, and hardware, or a combination of systems, environments, software, and hardware, as appropriate. In some implementations, various steps of method 300 can be run in parallel, in combination, in loops, or in any order.

At 302, historical well data corresponding to a well is received. The historical well data includes information about past operations of the well. For example, the historical well data can include well parameters of wellhead platform (WHP), gas-oil ratio (GOR), water cut (WC), productivity index (PI), and static bottom hole pressure (SBHP). In some implementations, a determination is made that the well model for the well is valid, including determining that data for the well model is complete. For example, validity of the well models is determined by (and dependent on) the ability of the model to accurately represent well performance. This can be done, for example, using physical correlations and ultimately measured by comparing well model rates to actual well rates. The historical well data can include, for example, the data regarding historical well tests, including values from historical well tests that occurred since the last completion. From 302, method 300 proceeds to 304.

At 304, an expanded minimum/maximum range of values is generated for parameters used in a well model for the well. The expanded minimum/maximum range of values expands a range of minimum/maximum values corresponding to the historical well data. For example, generating the expanded minimum/maximum range of values for parameters used in a well model for the well includes and setting a minimum of the expanded minimum/maximum range of values to a predetermined percentage less than a minimum of the minimum/maximum range of values corresponding to the historical well data and setting a maximum of the expanded minimum/maximum range of values to a predetermined percentage more than a maximum of the minimum/maximum range of values corresponding to the historical well data. The predetermined percentage can be 50%, for example. From 304, method 300 proceeds to 306.

At 306, object-oriented object instances representing the historical well data are generated using the historical well data and the expanded minimum/maximum range of values. Each object instance is an object configured to be used by the well model and includes a specific combination of parameters within the expanded minimum/maximum range of values. From 306, method 300 proceeds to 308.

At 308, the well model is executed using the object-oriented object instances. The well model can be executed using a language such as Python, for example. From 308, method 300 proceeds to 310.

At 310, result objects are generated based on the executing. Each result object is an object-oriented object instance representing a result of the well model. As an example, each object can be an object instance that is passable by Python to the well model. From 310, method 300 proceeds to 312.

At 312, a hybrid well model variant of the well model is generated using the object-oriented object instances and the result objects. The hybrid of the well model models combinations of the object-oriented object instances and the result objects. For example, the combinations can model different combinations of inputs variables and the corresponding outputs. From 312, method 300 proceeds to 314.

At 314, a data object encapsulating the object-oriented object instances and the result objects is passed by an object-oriented application to a machine learning model. Passing the data object occurs in an absence of database tables. For example, not using database tables can eliminate the expensive, time-consuming middleware practice normally used to store the data set in traditional tables. From 314, method 300 proceeds to 316.

At 316, the machine learning model is used to improve performance of one or more wells. For example, predictions can be made without the need for licenses associated with middleware solutions. After 316, method 300 can stop.

In some implementations, method 300 further includes providing a user interface for using the information provided by method 300. For example, the machine learning model can be executed using the data object. In response to the executing the machine learning model, an electric submersible pump (ESP) optimization dashboard can be generated, displaying suggestions for production improvements for a well. User-selected suggestions to change settings on ESPs used in the well can be implemented.

Figure 4:
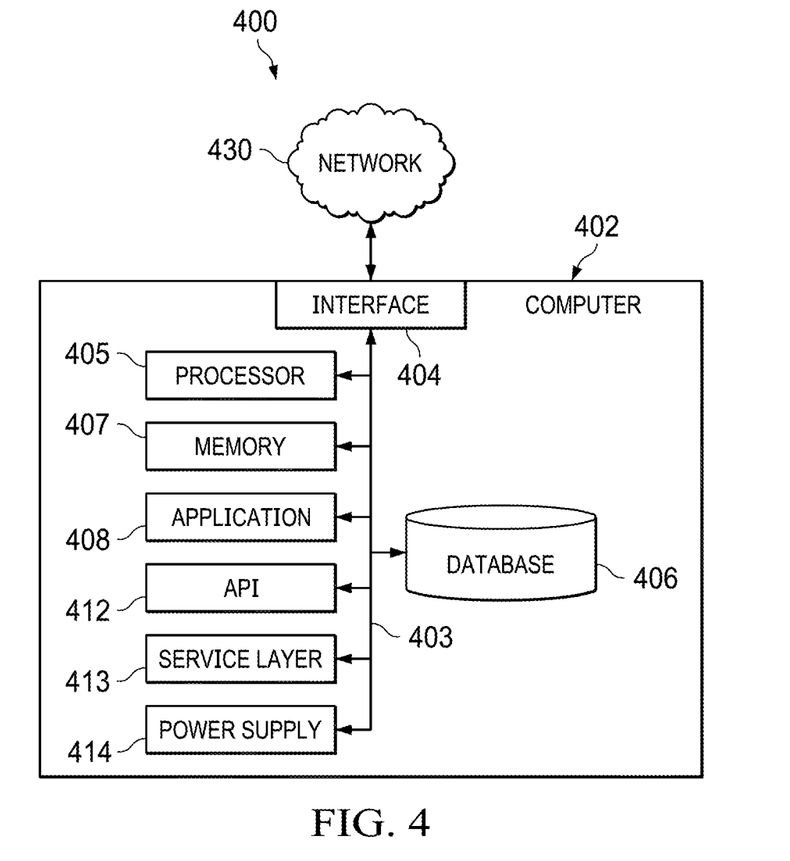
FIG. 4 is a block diagram illustrating an example computer system used to provide computational functionalities associated with described algorithms, methods, functions, processes, flows, and procedures as described in the present disclosure, according to some implementations of the present disclosure.

FIG. 4 is a block diagram of an example computer system 400 used to provide computational functionalities associated with described algorithms, methods, functions, processes, flows, and procedures described in the present disclosure, according to some implementations of the present disclosure. The illustrated computer 402 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 402 can include input devices such as keypads, keyboards, and touch screens that can accept user information. Also, the computer 402 can include output devices that can convey information associated with the operation of the computer 402. The information can include digital data, visual data, audio information, or a combination of information. The information can be presented in a graphical user interface (UI) (or GUI).

The computer 402 can serve in a role as a client, a network component, a server, a database, a persistency, or components of a computer system for performing the subject matter described in the present disclosure. The illustrated computer 402 is communicably coupled with a network 430. In some implementations, one or more components of the computer 402 can be configured to operate within different environments, including cloud-computing-based environments, local environments, global environments, and combinations of environments.

At a top level, the computer 402 is an electronic computing device operable to receive, transmit, process, store, and manage data and information associated with the described subject matter. According to some implementations, the computer 402 can also include, or be communicably coupled with, an application server, an email server, a web server, a caching server, a streaming data server, or a combination of servers.

The computer 402 can receive requests over network 430 from a client application (for example, executing on another computer 402). The computer 402 can respond to the received requests by processing the received requests using software applications. Requests can also be sent to the computer 402 from internal users (for example, from a command console), external (or third) parties, automated applications, entities, individuals, systems, and computers.

Each of the components of the computer 402 can communicate using a system bus 403. In some implementations, any or all of the components of the computer 402, including hardware or software components, can interface with each other or the interface 404 (or a combination of both) over the system bus 403. Interfaces can use an application programming interface (API) 412, a service layer 413, or a combination of the API 412 and service layer 413. The API 412 can include specifications for routines, data structures, and object classes. The API 412 can be either computer-language independent or dependent. The API 412 can refer to a complete interface, a single function, or a set of APIs.

The service layer 413 can provide software services to the computer 402 and other components (whether illustrated or not) that are communicably coupled to the computer 402. The functionality of the computer 402 can be accessible for all service consumers using this service layer. Software services, such as those provided by the service layer 413, can provide reusable, defined functionalities through a defined interface. For example, the interface can be software written in JAVA, C++, or a language providing data in extensible markup language (XML) format. While illustrated as an integrated component of the computer 402, in alternative implementations, the API 412 or the service layer 413 can be stand-alone components in relation to other components of the computer 402 and other components communicably coupled to the computer 402. Moreover, any or all parts of the API 412 or the service layer 413 can be implemented as child or sub-modules of another software module, enterprise application, or hardware module without departing from the scope of the present disclosure.

The computer 402 includes an interface 404. Although illustrated as a single interface 404 in FIG. 4, two or more interfaces 404 can be used according to particular needs, desires, or particular implementations of the computer 402 and the described functionality. The interface 404 can be used by the computer 402 for communicating with other systems that are connected to the network 430 (whether illustrated or not) in a distributed environment. Generally, the interface 404 can include, or be implemented using, logic encoded in software or hardware (or a combination of software and hardware) operable to communicate with the network 430. More specifically, the interface 404 can include software supporting one or more communication protocols associated with communications. As such, the network 430 or the interface's hardware can be operable to communicate physical signals within and outside of the illustrated computer 402.

The computer 402 includes a processor 405. Although illustrated as a single processor 405 in FIG. 4, two or more processors 405 can be used according to particular needs, desires, or particular implementations of the computer 402 and the described functionality. Generally, the processor 405 can execute instructions and can manipulate data to perform the operations of the computer 402, including operations using algorithms, methods, functions, processes, flows, and procedures as described in the present disclosure.

The computer 402 also includes a database 406 that can hold data for the computer 402 and other components connected to the network 430 (whether illustrated or not). For example, database 406 can be an in-memory, conventional, or a database storing data consistent with the present disclosure. In some implementations, database 406 can be a combination of two or more different database types (for example, hybrid in-memory and conventional databases) according to particular needs, desires, or particular implementations of the computer 402 and the described functionality. Although illustrated as a single database 406 in FIG. 4, two or more databases (of the same, different, or combination of types) can be used according to particular needs, desires, or particular implementations of the computer 402 and the described functionality. While database 406 is illustrated as an internal component of the computer 402, in alternative implementations, database 406 can be external to the computer 402.

The computer 402 also includes a memory 407 that can hold data for the computer 402 or a combination of components connected to the network 430 (whether illustrated or not). Memory 407 can store any data consistent with the present disclosure. In some implementations, memory 407 can be a combination of two or more different types of memory (for example, a combination of semiconductor and magnetic storage) according to particular needs, desires, or particular implementations of the computer 402 and the described functionality. Although illustrated as a single memory 407 in FIG. 4, two or more memories 407 (of the same, different, or combination of types) can be used according to particular needs, desires, or particular implementations of the computer 402 and the described functionality. While memory 407 is illustrated as an internal component of the computer 402, in alternative implementations, memory 407 can be external to the computer 402.

The application 408 can be an algorithmic software engine providing functionality according to particular needs, desires, or particular implementations of the computer 402 and the described functionality. For example, application 408 can serve as one or more components, modules, or applications. Further, although illustrated as a single application 408, the application 408 can be implemented as multiple applications 408 on the computer 402. In addition, although illustrated as internal to the computer 402, in alternative implementations, the application 408 can be external to the computer 402.

The computer 402 can also include a power supply 414. The power supply 414 can include a rechargeable or non-rechargeable battery that can be configured to be either user- or non-user-replaceable. In some implementations, the power supply 414 can include power-conversion and management circuits, including recharging, standby, and power management functionalities. In some implementations, the power-supply 414 can include a power plug to allow the computer 402 to be plugged into a wall socket or a power source to, for example, power the computer 402 or recharge a rechargeable battery.

There can be any number of computers 402 associated with, or external to, a computer system containing computer 402, with each computer 402 communicating over network 430. Further, the terms "client," "user," and other appropriate terminology can be used interchangeably, as appropriate, without departing from the scope of the present disclosure. Moreover, the present disclosure contemplates that many users can use one computer 402 and one user can use multiple computers 402.

Described implementations of the subject matter can include one or more features, alone or in combination.

For example, in a first implementation, a computer-implemented method includes the following. Historical well data corresponding to a well is received. The historical well data includes information about past operations of the well. An expanded minimum/maximum range of values is generated for parameters used in a well model for the well. The expanded minimum/maximum range of values expands a range of minimum/maximum values corresponding to the historical well data. Object-oriented object instances representing the historical well data are generated using the historical well data and the expanded minimum/maximum range of values. Each object instance is an object configured to be used by the well model and includes a specific combination of parameters within the expanded minimum/maximum range of values. The well model is executed using the object-oriented object instances. Result objects are generated based on the executing. Each result object is an object-oriented object instance representing a result of the well model. A hybrid well model variant of the well model is generated using the object-oriented object instances and the result objects. The hybrid of the well model models combinations of the object-oriented object instances and the result objects. A data object encapsulating the object-oriented object instances and the result objects is passed by an object-oriented application to a machine learning model. Passing the data object occurs in an absence of database tables. The machine learning model is used to improve performance of one or more wells.

The foregoing and other described implementations can each, optionally, include one or more of the following features:

A first feature, combinable with any of the following features, the method further including determining that the well model for the well is valid includes determining that data for the well model is complete.

A second feature, combinable with any of the previous or following features, where the historical well data includes well parameters of wellhead platform (WHP), gas-oil ratio (GOR), water cut (WC), productivity index (PI), and static bottom hole pressure (SBHP).

A third feature, combinable with any of the previous or following features, where generating the expanded minimum/maximum range of values for parameters used in a well model for the well includes and setting a minimum of the expanded minimum/maximum range of values to a predetermined percentage less than a minimum of the minimum/maximum range of values corresponding to the historical well data and setting a maximum of the expanded minimum/maximum range of values to a predetermined percentage more than a maximum of the minimum/maximum range of values corresponding to the historical well data.

A fourth feature, combinable with any of the previous or following features, where the predetermined percentage is 50%.

A fifth feature, combinable with any of the previous or following features, the method further including: executing the machine learning model using the data object; generating, in response to the executing, an electric submersible pump (ESP) optimization dashboard displaying suggestions for production improvements for a well; and implementing user-selected suggestions to change settings on ESPs used in the well.

A sixth feature, combinable with any of the previous or following features, where the object-oriented application is implemented in Python.

In a second implementation, a non-transitory, computer-readable medium stores one or more instructions executable by a computer system to perform operations including the following. Historical well data corresponding to a well is received. The historical well data includes information about past operations of the well. An expanded minimum/maximum range of values is generated for parameters used in a well model for the well. The expanded minimum/maximum range of values expands a range of minimum/maximum values corresponding to the historical well data. Object-oriented object instances representing the historical well data are generated using the historical well data and the expanded minimum/maximum range of values. Each object instance is an object configured to be used by the well model and includes a specific combination of parameters within the expanded minimum/maximum range of values. The well model is executed using the object-oriented object instances. Result objects are generated based on the executing. Each result object is an object-oriented object instance representing a result of the well model. A hybrid well model variant of the well model is generated using the object-oriented object instances and the result objects. The hybrid of the well model models combinations of the object-oriented object instances and the result objects. A data object encapsulating the object-oriented object instances and the result objects is passed by an object-oriented application to a machine learning model. Passing the data object occurs in an absence of database tables. The machine learning model is used to improve performance of one or more wells.

The foregoing and other described implementations can each, optionally, include one or more of the following features:

A first feature, combinable with any of the following features, the method further including determining that the well model for the well is valid includes determining that data for the well model is complete.

A second feature, combinable with any of the previous or following features, where the historical well data includes well parameters of wellhead platform (WHP), gas-oil ratio (GOR), water cut (WC), productivity index (PI), and static bottom hole pressure (SBHP).

A third feature, combinable with any of the previous or following features, where generating the expanded minimum/maximum range of values for parameters used in a well model for the well includes and setting a minimum of the expanded minimum/maximum range of values to a predetermined percentage less than a minimum of the minimum/maximum range of values corresponding to the historical well data and setting a maximum of the expanded minimum/maximum range of values to a predetermined percentage more than a maximum of the minimum/maximum range of values corresponding to the historical well data.

A fourth feature, combinable with any of the previous or following features, where the predetermined percentage is 50%.

A fifth feature, combinable with any of the previous or following features, the method further including: executing the machine learning model using the data object; generating, in response to the executing, an electric submersible pump (ESP) optimization dashboard displaying suggestions for production improvements for a well; and implementing user-selected suggestions to change settings on ESPs used in the well.

A sixth feature, combinable with any of the previous or following features, where the object-oriented application is implemented in Python.

In a third implementation, a computer-implemented system includes one or more processors and a non-transitory computer-readable storage medium coupled to the one or more processors and storing programming instructions for execution by the one or more processors. The programming instructions instruct the one or more processors to perform operations including the following. Historical well data corresponding to a well is received. The historical well data includes information about past operations of the well. An expanded minimum/maximum range of values is generated for parameters used in a well model for the well. The expanded minimum/maximum range of values expands a range of minimum/maximum values corresponding to the historical well data. Object-oriented object instances representing the historical well data are generated using the historical well data and the expanded minimum/maximum range of values. Each object instance is an object configured to be used by the well model and includes a specific combination of parameters within the expanded minimum/maximum range of values. The well model is executed using the object-oriented object instances. Result objects are generated based on the executing. Each result object is an object-oriented object instance representing a result of the well model. A hybrid well model variant of the well model is generated using the object-oriented object instances and the result objects. The hybrid of the well model models combinations of the object-oriented object instances and the result objects. A data object encapsulating the object-oriented object instances and the result objects is passed by an object-oriented application to a machine learning model. Passing the data object occurs in an absence of database tables. The machine learning model is used to improve performance of one or more wells.

The foregoing and other described implementations can each, optionally, include one or more of the following features:

A first feature, combinable with any of the following features, the method further including determining that the well model for the well is valid includes determining that data for the well model is complete.

A second feature, combinable with any of the previous or following features, where the historical well data includes well parameters of wellhead platform (WHP), gas-oil ratio (GOR), water cut (WC), productivity index (PI), and static bottom hole pressure (SBHP).

A third feature, combinable with any of the previous or following features, where generating the expanded minimum/maximum range of values for parameters used in a well model for the well includes and setting a minimum of the expanded minimum/maximum range of values to a predetermined percentage less than a minimum of the minimum/maximum range of values corresponding to the historical well data and setting a maximum of the expanded minimum/maximum range of values to a predetermined percentage more than a maximum of the minimum/maximum range of values corresponding to the historical well data.

A fourth feature, combinable with any of the previous or following features, where the predetermined percentage is 50%.

A fifth feature, combinable with any of the previous or following features, the method further including: executing the machine learning model using the data object; generating, in response to the executing, an electric submersible pump (ESP) optimization dashboard displaying suggestions for production improvements for a well; and implementing user-selected suggestions to change settings on ESPs used in the well.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include AI applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/-R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
   receiving historical well data corresponding to a well, wherein the historical well data comprises information about past operations of the well;
   generating an expanded range of values for parameters used in a well model for the well, wherein the expanded range of values expands a range of values corresponding to the historical well data;
   generating, using the historical well data and the expanded range of values, object-oriented object instances representing the historical well data, wherein each object-oriented object instance is an object configured to be used by the well model and comprising a combination of parameters within the expanded range of values;
   executing the well model using the object-oriented object instances to generate result objects, wherein each result object is an object-oriented object instance representing a result of the well model;
   generating, using the object-oriented object instances and the result objects, a hybrid well model variant of the well model that models combinations of the object-oriented object instances and the result objects;
   passing, by an object-oriented application, a data object encapsulating the object-oriented object instances and the result objects to a machine learning model, wherein passing the data object occurs in an absence of database tables;
   executing the machine learning model using the data object;
   generating, in response to the executing, an electric submersible pump (ESP) optimization dashboard displaying suggestions for production improvements for a well; and
   implementing user-selected suggestions to change settings on ESPs used in the well.

2. The computer-implemented method of claim 1, further comprising:
   determining that the well model for the well is valid comprises determining that data for the well model is complete.

3. The computer-implemented method of claim 1, wherein the historical well data comprises well parameters of wellhead platform (WHP), gas-oil ratio (GOR), water cut (WC), productivity index (PI), and static bottom hole pressure (SBHP).

4. The computer-implemented method of claim 1, wherein generating the expanded range of values for parameters used in a well model for the well includes and setting a minimum of the expanded range of values to a predetermined percentage less than a minimum of the range of values corresponding to the historical well data and setting a maximum of the expanded range of values to a predetermined percentage more than a maximum of the range of values corresponding to the historical well data.

5. The computer-implemented method of claim 4, wherein the predetermined percentage is 50%.

6. The computer-implemented method of claim 1, wherein the object-oriented application is implemented in Python.

7. The computer-implemented method of claim 1, wherein the
   settings on ESPs comprise a pump frequency.

8. A non-transitory, computer-readable medium storing one or more instructions executable by a computer system to perform operations comprising:
   receiving historical well data corresponding to a well, wherein the historical well data comprises information about past operations of the well;
   generating an expanded range of values for parameters used in a well model for the well, wherein the expanded range of values expands a range of values corresponding to the historical well data;
   generating, using the historical well data and the expanded range of values, object-oriented object instances representing the historical well data, wherein each object-oriented object instance is an object configured to be used by the well model and comprising a combination of parameters within the expanded range of values;
   executing the well model using the object-oriented object instances to generate result objects, wherein each result object is an object-oriented object instance representing a result of the well model;
   generating, using the object-oriented object instances and the result objects, a hybrid well model variant of the well model that models combinations of the object-oriented object instances and the result objects;

passing, by an object-oriented application, a data object encapsulating the object-oriented object instances and the result objects to a machine learning model, wherein passing the data object occurs in an absence of database tables;

executing the machine learning model using the data object;

generating, in response to the executing, an electric submersible pump (ESP) optimization dashboard displaying suggestions for production improvements for a well; and implementing user-selected suggestions to change settings on ESPs used in the well.

9. The non-transitory, computer-readable medium of claim 8, the operations further comprising:

determining that the well model for the well is valid comprises determining that data for the well model is complete.

10. The non-transitory, computer-readable medium of claim 8, wherein the historical well data comprises well parameters of wellhead platform (WHP), gas-oil ratio (GOR), water cut (WC), productivity index (PI), and static bottom hole pressure (SBHP).

11. The non-transitory, computer-readable medium of claim 8, wherein generating the expanded range of values for parameters used in a well model for the well comprises and setting a minimum of the expanded range of values to a predetermined percentage less than a minimum of the range of values corresponding to the historical well data and setting a maximum of the expanded range of values to a predetermined percentage more than a maximum of the range of values corresponding to the historical well data.

12. The non-transitory, computer-readable medium of claim 11, wherein the predetermined percentage is 50%.

13. The non-transitory, computer-readable medium of claim 8, wherein the object-oriented application is implemented in Python.

14. The non-transitory, computer-readable medium of claim 8, wherein the settings on ESPs comprise a pump frequency.

15. A computer-implemented system, comprising:

one or more processors; and a non-transitory computer-readable storage medium coupled to the one or more processors and storing programming instructions for execution by the one or more processors, the programming instructions instructing the one or more processors to perform operations comprising:

receiving historical well data corresponding to a well, wherein the historical well data comprises information about past operations of the well;

generating an expanded range of values for parameters used in a well model for the well, wherein the expanded range of values expands a range of values corresponding to the historical well data;

generating, using the historical well data and the expanded range of values, object-oriented object instances representing the historical well data, wherein each object-oriented object instance is an object configured to be used by the well model and comprising a combination of parameters within the expanded range of values;

executing the well model using the object-oriented object instances to generate result objects, wherein each result object is an object-oriented object instance representing a result of the well model;

generating, using the object-oriented object instances and the result objects, a hybrid well model variant of the well model that models combinations of the object-oriented object instances and the result objects;

passing, by an object-oriented application, a data object encapsulating the object-oriented object instances and the result objects to a machine learning model, wherein passing the data object occurs in an absence of database tables;

executing the machine learning model using the data object;

generating, in response to the executing, an electric submersible pump (ESP) optimization dashboard displaying suggestions for production improvements for a well; and implementing user-selected suggestions to change settings on ESPs used in the well.

16. The computer-implemented system of claim 15, the operations further comprising:

determining that the well model for the well is valid comprises determining that data for the well model is complete.

17. The computer-implemented system of claim 15, wherein the historical well data comprises well parameters of wellhead platform (WHP), gas-oil ratio (GOR), water cut (WC), productivity index (PI), and static bottom hole pressure (SBHP).

18. The computer-implemented system of claim 15, wherein generating the expanded range of values for parameters used in a well model for the well comprises and setting a minimum of the expanded range of values to a predetermined percentage less than a minimum of the range of values corresponding to the historical well data and setting a maximum of the expanded range of values to a predetermined percentage more than a maximum of the range of values corresponding to the historical well data.

19. The computer-implemented system of claim 18, wherein the predetermined percentage is 50%.

20. The computer-implemented system of claim 15, wherein the object-oriented application is implemented in Python.

* * * * *

UNITED STATES PATENT AND TRADEMARK OFFICE
CERTIFICATE OF CORRECTION

| | |
|---|---|
| PATENT NO. | : 12,412,001 B2 |
| APPLICATION NO. | : 17/499026 |
| DATED | : September 9, 2025 |
| INVENTOR(S) | : Obiomalotaoso Leonard Isichei et al. |

Page 1 of 1

It is certified that error appears in the above-identified patent and that said Letters Patent is hereby corrected as shown below:

In the Claims

In Column 18, Line 42, Claim 7, please delete "settings on ESPs comprise a pump frequency." and insert -- settings on ESPs comprise a pump frequency. -- in Column 18, Line 41, as a continuation of the same subpoint.

In Column 19, Line 40, Claim 14, please delete "settings on ESPs comprise a pump frequency." and insert -- settings on ESPs comprise a pump frequency. -- in Column 19, Line 39, as a continuation of the same subpoint.

Signed and Sealed this
Eighteenth Day of November, 2025

John A. Squires
*Director of the United States Patent and Trademark Office*